United States Patent
Tsuboi et al.

(10) Patent No.: US 6,774,673 B2
(45) Date of Patent: Aug. 10, 2004

(54) LEVEL SHIFTER

(75) Inventors: Hiroyoshi Tsuboi, Kawasaki (JP); Yoshiaki Okuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/270,135

(22) Filed: Oct. 15, 2002

(65) Prior Publication Data

US 2003/0098711 A1 May 29, 2003

(30) Foreign Application Priority Data

Nov. 28, 2001 (JP) ........................................ 2001-362490
May 20, 2002 (JP) ........................................ 2002-145080

(51) Int. Cl.[7] .............................................. H03K 19/094
(52) U.S. Cl. ............................... 326/68; 326/80; 326/81
(58) Field of Search .............................. 326/68, 80, 81, 326/82, 83; 327/333

(56) References Cited

U.S. PATENT DOCUMENTS 5,825,225 A * 10/1998 Sugisawa et al. ........... 327/208

FOREIGN PATENT DOCUMENTS

| EP | 433271 A2 | 7/1986 |
| EP | 439141 A1 | 1/1991 |
| EP | 667878 A2 | 11/1994 |
| EP | 809249 A1 | 11/1997 |

OTHER PUBLICATIONS

European Search Report.

* cited by examiner

*Primary Examiner*—Anh Q. Tran
(74) *Attorney, Agent, or Firm*—Arent Fox PLLC

(57) ABSTRACT

A first switch operates in accordance with a control signal and receives an input signal. A voltage conversion circuit converts the input signal having a voltage and transmitted via the first switch to an output signal having a different voltage, and outputs the signal. A second switch connects an output node thereof to a voltage line supplied with a voltage which the voltage conversion circuit should output in accordance with the input signal. Therefore, even the input signal's voltage falling outside the range in which the voltage conversion circuit normally operates, the voltage that the voltage conversion circuit should intrinsically output is supplied to the output node via the second switch. Thus, reliable conversion of the input signal voltage is achieved, resulting in secure operation of the level shifter even during a low power supply voltage. This also prevents malfunction of the semiconductor integrated circuit incorporating such level shifters.

4 Claims, 6 Drawing Sheets

LEVEL SHIFTER

BACKGROUND OF THE INVENTION

1. Field of the Invention

The present invention relates to level shifters formed in a semiconductor integrated circuit for converting input signals having voltages to output signals having different voltages from the voltages of the input signals.

2. Description of the Related Art

In a semiconductor memory such as a DRAM or the like, the word lines for selecting memory cells are connected to the transfer transistors of the memory cells. In general, the high level voltages (boost voltages) of the word lines are set to a value higher than the power supply voltage so as to increase the amount of data that can be written into the memory cells and improve the data retention characteristics of the memory cells.

In this kind of DRAM, each of word decoders for selecting the respective predetermined word lines has: an address decoder for decoding an address signal supplied from the exterior of the DRAM; and a level shifter for converting the voltage of the decoded signal outputted from the address decoder to a boost voltage. Then, the boost voltage as converted by the level shifter is used as the high level voltage of the associated word line.

FIG. 1 shows an example of the level shifter formed in a word decoder.

The level shifter has: a switch 10 that is configured of an nMOS transistor and that receives a decoded signal DEC1; a voltage conversion circuit 12 that receives the decoded signal DEC1 supplied via the switch 10; and a CMOS inverter 14 that outputs, as a word line signal MWL, the decoded signal DEC1 whose voltage level has been converted by the voltage converter circuit 12.

The gate of the switch 10 is controlled by a control signal CNT. The control signal CNT is generated for use in common to a plurality of word decoders. The control signal CNT is generated from the decoded signal of an upper address signal and serves as a block selecting signal for selecting the plurality of word decoders. The high level of the control signal CNT is set to the power supply voltage, while the low level of the control signal CNT is set to the ground voltage. The decoded signal DEC1 inputted to the switch 10 is the decoded signal of a lower address signal outputted by the word decoder.

The voltage conversion circuit 12 is configured of CMOS inverters 12a and 12b with their inputs and outputs connected together. The pMOS transistors of the voltage conversion circuit 12 have their sources connected to boost voltage lines VPP. The nMOS transistors of the voltage conversion circuit 12 have their sources connected to negative voltage lines VNWL.

The pMOS transistor of the CMOS inverter 14 has its source connected to a boost voltage line VPP. The nMOS transistor of the CMOS inverter 14 receives at its source a decoded signal DEC2, which exhibits the same logic and changes at the same timing as the decoded signal DEC1. The CMOS inverter 14 outputs to the associated word line a word line signal MWL of the same logic level as the decoded signal DEC1.

In the above described level shifter, when the decoded signal DEC1 exhibits a low level (−0.5 V), the PMOS transistor of the CMOS inverter 12a is turned on and the nMOS transistor of the CMOS inverter 14 is turned on. At this moment, the nMOS transistor of the CMOS inverter 14 receives at its source a low level (−0.5 V) of the decoded signal DEC2. Accordingly, the CMOS inverter 14 outputs a low level (−0.5 V) of the word line signal MWL to the word line.

Contrarily, when the decoded signal DEC1 exhibits a high level (the power supply voltage), the nMOS transistor of the CMOS inverter 12a is turned on and the pMOS transistor of the CMOS inverter 14 is turned on. At this moment, the pMOS transistor of the CMOS inverter 14 receives at its source the boost voltage VPP. Accordingly, the CMOS inverter 14 outputs to the word line a word line signal MWL whose voltage (VPP) is higher than the high level voltage of the decoded signal DEC1.

It should be noted that a negative voltage VNWL is being applied to the gate of the nMOS transistor of the CMOS inverter 12a, and hence the source-to-gate voltage of the pMOS transistor of the CMOS inverter 14 is increased. Accordingly, the on-resistance of the PMOS transistor of the CMOS inverter 14 is reduced, and hence the current supplied to the word line is increased.

There is a yearly increasing tendency that semiconductor integrated circuits, such as DRAMs and the like, are designed to use less power supply voltage so as to reduce the power consumption. In the level shifter shown in FIG. 1, the switch 10 for transmitting the decoded signal DEC1 to the voltage conversion circuit 12 is configured of the nMOS transistor. The switch 10, when receiving at its gate the high level of the control signal CNT (the power supply voltage), is turned on to transmit the voltage of the decoded signal DEC1 to the voltage conversion circuit 12. At this moment, the voltage conversion circuit 12 receives at its input the high level voltage having a value obtained by subtracting the threshold voltage of the nMOS transistor from the power supply voltage.

When the power supply voltage is low and the high level voltage of the input signal DEC1 is low, the high level voltage supplied to the CMOS inverter 12a is also low. When the high level voltage supplied to the CMOS inverter 12a is lower than the threshold voltage of the nMOS transistor of the CMOS inverter 12a, this nMOS transistor cannot be turned on. Consequently, the level shifter cannot output a normal word line signal, resulting in a malfunction of the DRAM.

SUMMARY OF THE INVENTION

It is an object of the present invention to provide a level shifter that reliably operates even when the power supply voltage is low.

According to one of the aspects of the level shifter of the present invention, a first switch operates in accordance with a control signal and receives an input signal. A voltage conversion circuit converts the input signal, which has a voltage and is transmitted via the first switch, to an output signal having a different voltage from the voltage of the input signal, and outputs the output signal. A second switch connects an output node of the voltage conversion circuit to a voltage line corresponding with a voltage which the voltage conversion circuit should output in accordance with the input signal. For this reason, even when the voltage of the input signal falls outside the voltage range in which the voltage conversion circuit normally operates, for example, the voltage that the voltage conversion circuit should intrinsically output is supplied to the output node via the second switch. Thus, the voltage of the input signal can be converted without fail. As a result, the level shifter reliably operates even when the power supply voltage is low. In addition, the semiconductor integrated circuit incorporating such level shifters can be prevented from malfunctioning.

According to another aspect of the level shifter of the present invention, the first switch, voltage conversion circuit and second switch each includes at least one of pMOS transistors and nMOS transistors. The threshold voltages of the pMOS transistors are equal to each other, and/or the threshold voltages of nMOS transistors are equal to each other. In some conventional cases transistors having different threshold voltages are formed so as to increase the operation margin of a voltage conversion circuit so that the voltage conversion circuit operates without fail even when the power supply voltage is low. In such cases, the ion implantation amount has to be changed in accordance with the different threshold voltages of the transistors, which increases the number of the photo masks. The present invention, however, realizes sure conversion of the voltage of the input signal without changing the threshold voltages of the transistors, facilitating the layout design (mask design) of the level shifter.

According to another aspect of the level shifter of the present invention, the voltage conversion circuit has a pair of CMOS inverters with their inputs and outputs connected to each other. The second switch has an nMOS transistor. The second switch turns on when the nMOS transistor of one of the CMOS inverters that receives the input signal should turn on, to supply a low level voltage to the output node. When the power supply voltage is low, the high level voltage of the input signal is accordingly low. In a case where the high level voltage of the input signal is lower than the threshold voltage of the nMOS transistor of the CMOS inverter that receives the input signal, the nMOS transistor cannot turn on. Consequently, the voltage conversion circuit cannot output the low level voltage to the output node. According to the present invention, however, even in such a case, the turning-on of the second switch can set the output node to having the low level voltage. That is, the margin of the operation voltage of the level shifter can be improved.

According to another aspect of the level shifter of the present invention, the voltage conversion circuit has a pair of CMOS inverters with their inputs and outputs connected to each other. The second switch has a pMOS transistor. The second switch turns on when the pMOS transistor of one of the CMOS inverters that receives the input signal should turn on, to supply a high level voltage to the output node. Thus, it is able to turn the output node to the high level with reliability by generating the high level voltage of the output node using not only the voltage conversion circuit but also the second switch. That is, the margin of the operation voltage of the level shifter can be improved.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Embodiments of the present invention will be described below with reference to the drawings.

Figure 2:
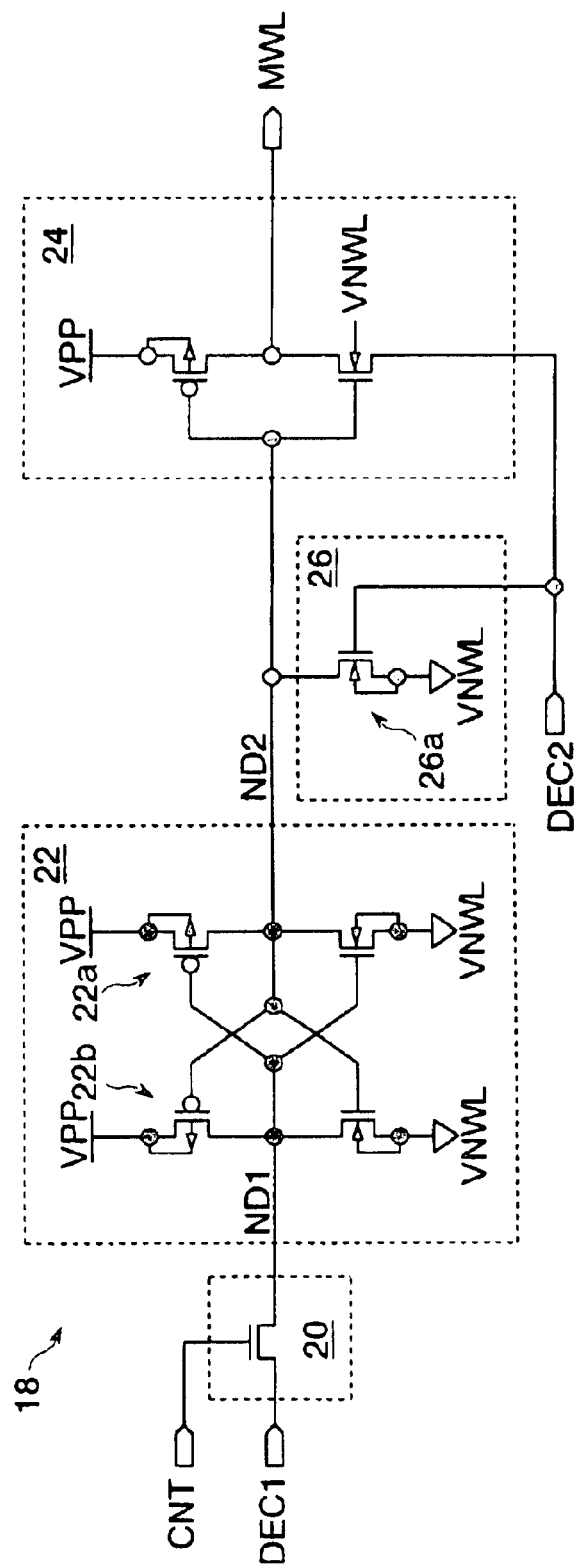
FIG. 2 is a circuit diagram showing a first embodiment of the level shifter according to the present invention.

FIG. 2 shows a first embodiment of the level shifter according to the present invention.

Detailed descriptions are omitted with respect to circuits corresponding to the same circuits of the forgoing prior art. A level shifter 18 is formed in each word decoder of a DRAM. The DRAM is formed on a silicon substrate by use of a CMOS process. Each word decoder has, in addition to the level shifter 18, a decoder for decoding an address signal supplied from the exterior of the DRAM. The word decoder uses the level shifter 18 to convert the voltage level of a decoded signal generated by the decoder, and supplies the converted voltage to the associated word line.

The level shifter 18 has: a first switch 20 configured of an nMOS transistor and receiving the decoded signal DEC1 (input signal); a voltage conversion circuit 22 that receives, via a node ND1, the decoded signal DEC1 supplied via the first switch 20; a CMOS inverter 24 that outputs, as a word line signal MWL, the decoded signal DEC1 whose voltage level has been converted by the voltage conversion circuit 22; and a second switch 26.

Figure 1:
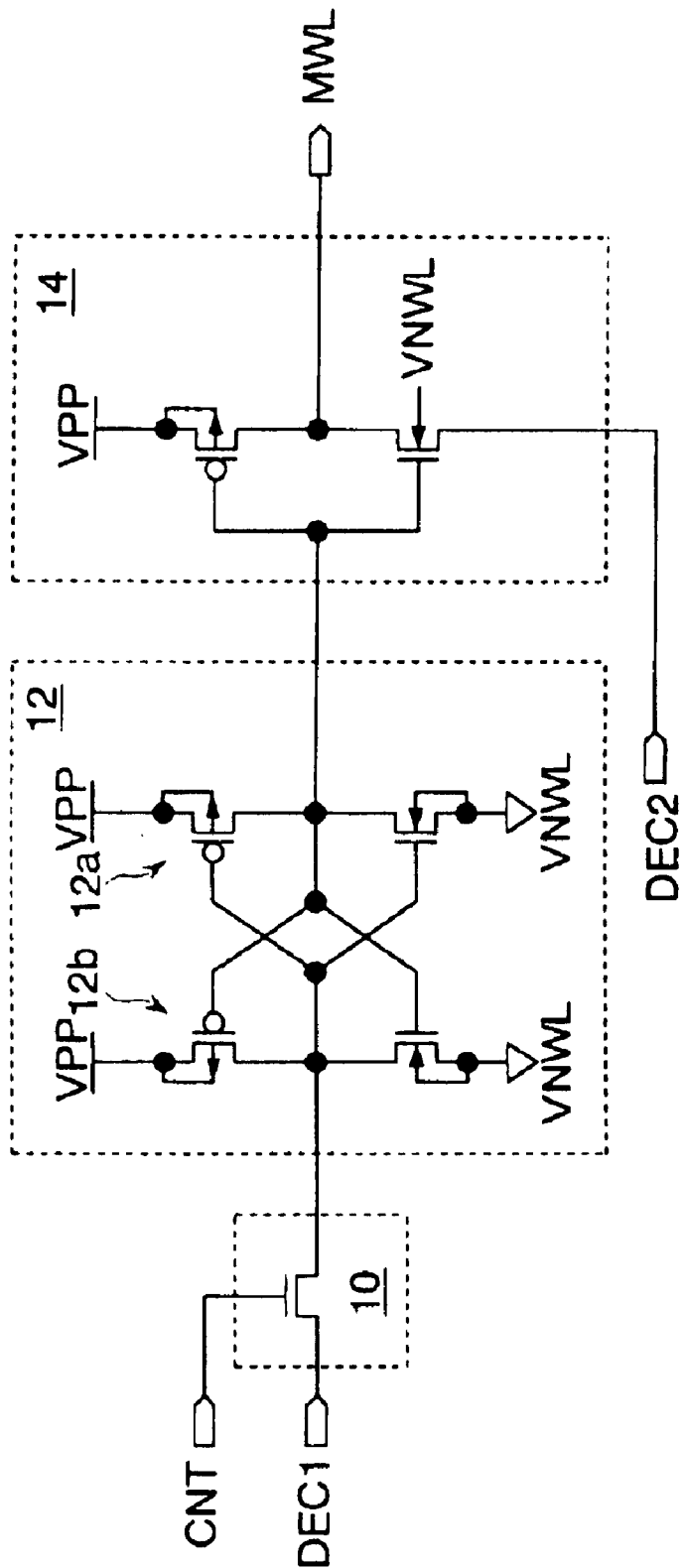
FIG. 1 is a circuit diagram showing a conventional level shifter.

The first switch 20, voltage conversion circuit 22 and CMOS inverter 24 have the same structures as the switch 10, voltage conversion circuit 12 and CMOS inverter 14 shown in FIG. 1, respectively. That is, the voltage conversion circuit 22 has a pair of CMOS inverters that have their inputs and outputs connected to each other and receive high and low level voltages.

In the present embodiment, the pMOS transistors of the voltage conversion circuit 22 and CMOS inverter 24 have the same threshold voltage value as each other, while the nMOS transistors of the first switch 20, voltage conversion circuit 22, CMOS inverter 24 and the second switch 26 have the same threshold voltage value as each other. For this reason, the number of the photo masks to be used for ion implantation to set the threshold voltage values can be minimized, and hence the layout design (mask design) of the level shifter 18 can be simplified.

An internal power supply voltage VII is generated by using an internal voltage generator (not shown) to drop an external power supply voltage (2 V) supplied from the exterior of the DRAM. The high level voltages of the decoded signal DEC1 and control signal CNT are set to the internal power supply voltage VII (1.2 V). The low level voltage of the decoded signal DEC1 is set to a negative voltage (-0.5 V), while the low level voltage of the control signal CNT is set to the ground voltage (0 V).

The control signal CNT is generated for use in common to a plurality of word decoders. The control signal CNT is generated from the decoded signal of an upper address signal and serves as a block selecting signal for selecting the plurality of word decoders. The decoded signal DEC1 inputted to the first switch 20 is the decoded signal of a lower address signal outputted from the word decoder. The control signal CNT is generated by the address decoder in the word decoder.

Each pMOS transistor of the voltage conversion circuit 22 has its source connected to a respective boost voltage line VPP (3 V), while each nMOS transistor of the voltage conversion circuit 22 has its source connected to a respective negative voltage line VNWL (−0.5 V).

The nMOS transistor of the CMOS inverter 24 receives at its source a decoded signal DEC2, which exhibits the same logic and changes at the same timing as the decoded signal DEC1. The CMOS inverter 24 outputs, to the word line, the word line signal MWL (output signal) of the same logic level as the decoded signal DEC1, as will be described later.

The second switch 26 is configured of an nMOS transistor 26a. The drain of nMOS transistor 26a is connected to an output node ND2 of the voltage conversion circuit 22, while the source thereof is connected to a negative voltage line VNWL. The nMOS transistor 26a receives at its gate the decoded signal DEC2. When the nMOS transistor of the CMOS inverter 22a should be turned on, the nMOS transistor 26a is turned on to supply a low level (VNWL) to the node ND2, as will be described later. That is, the signal line that supplies the decoded signal DEC2 to the second switch 26 serves as a voltage line for supplying the same voltage as the low level voltage VNWL that should be outputted by the voltage conversion circuit 22.

Figure 3:
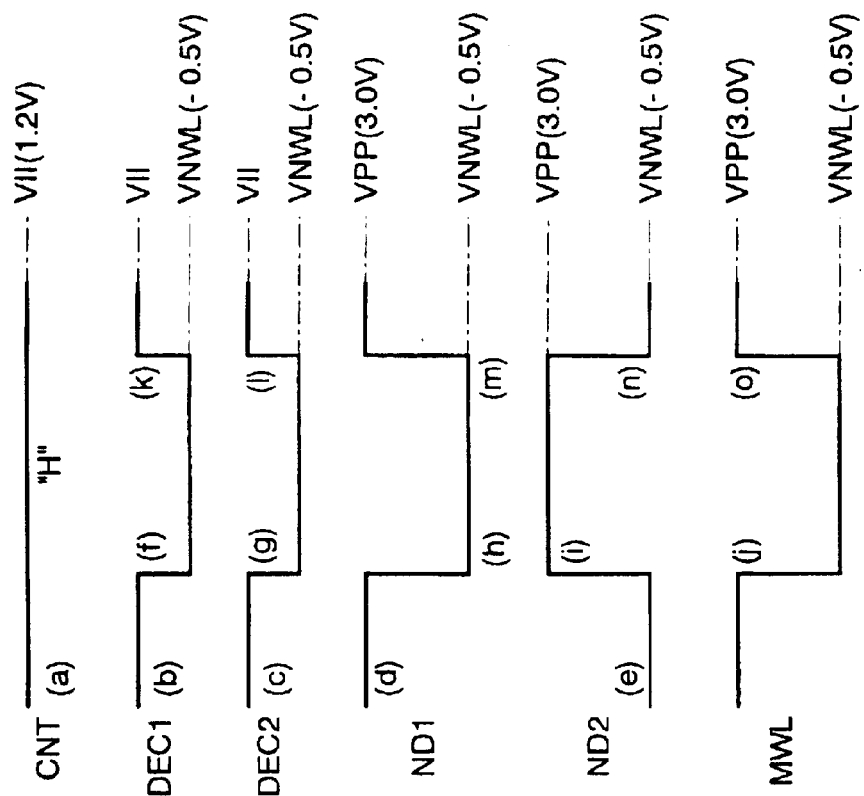
FIG. 3 is a timing diagram showing the operation of the level shifter shown in FIG. 2.

FIG. 3 shows the operation of the level shifter 18 shown in FIG. 2. In this example, the word decoders associated with a predetermined memory cell array have been activated, and the control signal CNT that controls the first switch 20 in each word decoder is held at the high level (VII) (FIG. 3(a)).

Before the word decoder starts a decoding operation, the decoded signals DEC1 and DEC2 both exhibit the high levels (VII) (FIG. 3(b) and (c)). At this moment, the node ND1 exhibits the high level (FIG. 3(d), while the node ND2 exhibits the low level (VNWL) (FIG. 3(e)). In the case of the level shifter of the prior art, the high level voltage of the node ND1 would be lower than the high level voltage (VII) of the decoded signal DEC1 by the threshold voltage (VTH) of the nMOS transistor of the first switch 20 (VII−VTH). For this reason, there would be a possibility that when the internal power supply voltage VII is low, the nMOS transistor of the CMOS inverter 22a in the voltage conversion circuit 22 is not sufficiently turned on. According to the present invention, however, since the low level of the node ND2 is set not only by the turning-on of the nMOS transistor of the CMOS inverter 22a but also by the turning-on of the nMOS transistor 26a of the second switch 26, the high level of the node ND1 can be the boost voltage VPP, turning on the nMOS transistor of the CMOS inverter 22a without fail. Accordingly, the high level voltage VII of the decoded signal DEC1 is converted to the boost voltage VPP without fail.

Thereafter, an address signal is supplied from the exterior of the DRAM, and the decoded signal DEC1 associated with the word line to be selected changes from the high level (VII) to the low level (VNWL) (FIG. 3(f)). In synchronism with the decoded signal DEC1, the decoded signal DEC2 changes from the high level (VII) to the low level (VNWL) (FIG. 3(g)). The node ND1 changes to the low level in accordance with the change in the decoded signal DEC1 (FIG. 3(h)).

The pMOS transistor of the CMOS inverter 22a in the voltage conversion circuit 22 is turned on by the low level of the node ND1, and the node ND2 changes to the high level (VPP) (FIG. 3(i)). The nMOS transistor of the CMOS inverter 24 is turned on by the high level of the node ND2 and outputs the low level (negative voltage) of the word line signal MWL (FIG. 3 (j)). On the other hand, the second switch 26 is turned off in accordance with the change in the decoded signal DEC2. The low level of the word line signal MWL is inverted by a control circuit (not shown), so that the high level voltage (VPP) is supplied to the word line. That is, the word line associated with the address signal is selected to execute the memory operation.

Next, the address decoder in the word decoder completes its operation, and the decoded signal DEC1 and DEC2 change to the high levels (VII) (FIG. 3(k) and (l)). In accordance with the change in the decoded signal DEC1, the node ND1 changes to the high level (VPP) (FIG. 3 (m)). The nMOS transistor of the CMOS inverter 22a in the voltage conversion circuit 22 is turned on again by the high level of the node ND1 to change the node ND2 to the low level (VNWL) (FIG. 3(n)). In response to the change in the node ND2 to the low level, the word line signal MWL changes to the high level (VPP) (FIG. 3(o)).

In accordance with the change in the decoded signal DEC2, the nMOS transistor 26a of the second switch 26 is also turned on again to change the node ND2 to the low level. The high level voltage (VII) of the decoded signal DEC2 is higher than the high level voltage of the node ND1 (VII−VTH). For this reason, the on-resistance of the nMOS transistor 26a of the second switch 26 becomes lower than the on-resistance of the nMOS transistor of the CMOS inverter 24. Accordingly, the voltage level of the node ND2 quickly changes to the low level in response to the change in the decoded signal DEC2 to the high level. In other words, the timing at which the word line signal MWL turns to the high level (the reset timing of the word line) is earlier than in the prior art. As a result, the precharge operation after the DRAM memory operation can be commenced earlier than in the prior art, and hence the access time can be shortened. The precharge operation referred to here is an operation for setting to a predetermined voltage the bit lines through which data are inputted to and outputted from memory cells.

The use of the boost voltage VPP for selecting the word line can increase the amount of the data that can be written into the memory cells, and can improve the data retention characteristics of the memory cells, as in the prior art.

Figure 4:
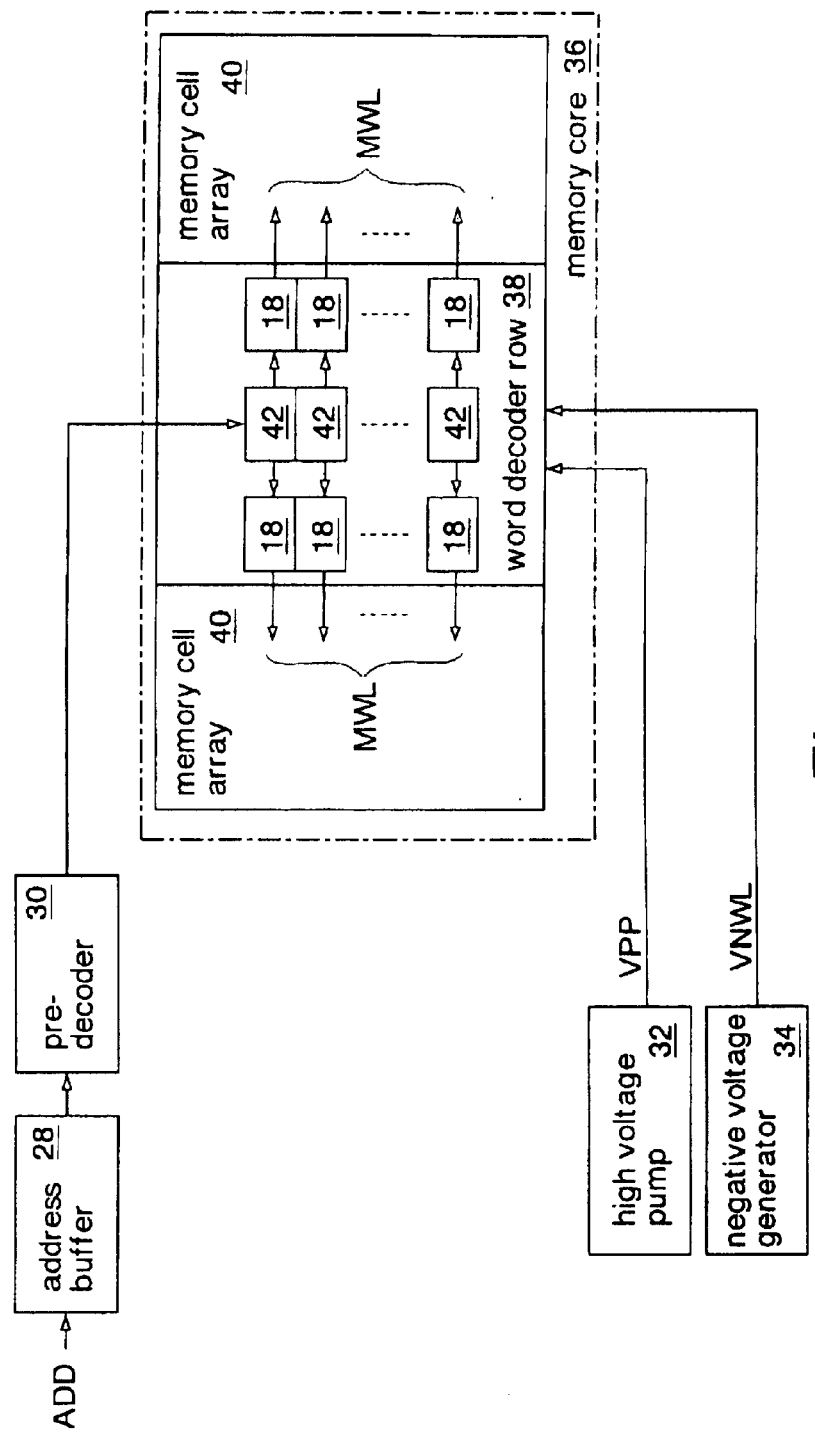
FIG. 4 is a block diagram showing an outline of a DRAM to which the level shifters of the present invention have been applied.

FIG. 4 shows an outline of the DRAM to which the level shifters of the present invention have been applied. The DRAM has an address buffer 28 that receives an address signal ADD; a predecoder 30 that predecodes the address signal ADD; a high voltage pump 32 that generates the boost voltage VPP; a negative voltage generator 34 that generates the negative voltage VNWL; and a memory core 36.

The memory core 36 has a word decoder row 38 and a pair of memory cell arrays 40. The word decoder row 38 has a plurality of word decoders 42 each of which receives a predecoded signal from the predecoder 30 and generates a decoded signal, and the level shifters 18 of FIG. 2 associated with the memory cell arrays 40. Each level shifter 18 converts the high level voltage (the internal power supply voltage VII) of the decoded signal from the associated word decoder 42 to the boost voltage VPP, and outputs this boost voltage VPP as the word line signal MWL.

The memory core 36 activates, in accordance with an upper address signal, one of the memory cell arrays 40. At this moment, each of the level shifters 18 associated with the memory cell array 40 that is not activated has its first switch 20 of FIG. 2 turned off, and hence performs no voltage conversion operation.

Each of the level shifters 18 associated with the memory cell array 40 that is activated has its first switch 20 of FIG. 2 turned on, and hence performs a voltage conversion of the decoded signal and outputs, as the word line signal MWL, the decoded signal whose voltage has been converted.

In the present embodiment described above, when the voltage conversion circuit 22 should output the low level voltage (VNWL) to the node ND2, the node ND2 is connected to the negative voltage line VNWL via the second switch 26. For this reason, even when the internal power supply voltage VII is low and hence the high level voltage of the decoded signal DEC1 is low, the node ND2 can exhibit the negative voltage VNWL without fail, so that the level shifter 18 can operate without fail.

The threshold voltages of the pMOS transistors in the level shifter 18 were set to the same values as each other, and those of the nMOS transistors therein were also set to the same values as each other. In such a case, too, the voltage of the input signal can be converted without fail because of the function of the second switch 26. As a result, there is no need to use any masks for adjusting the threshold voltages, and hence the layout design (mask design) can be simplified.

Figure 5:
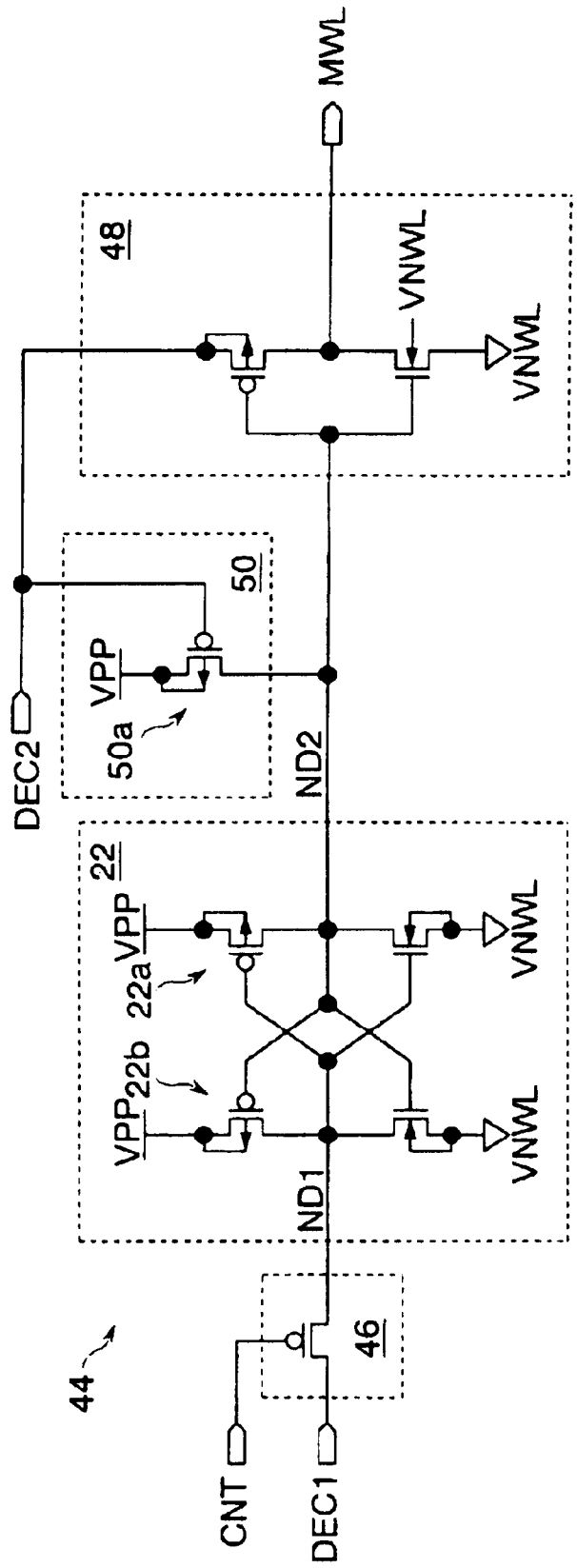
FIG. 5 is a circuit diagram showing a second embodiment of the level shifter according to the present invention.

FIG. 5 shows a second embodiment of the level shifter according to the present invention. In the second embodiment, elements corresponding to the same elements in the first embodiment are identified by the same reference designations and their detailed descriptions are omitted. A level shifter 44 is formed in each word decoder of a DRAM as in the first embodiment. Each word decoder has, in addition to the level shifter 44, an address decoder for decoding an address signal supplied from the exterior of the DRAM. The word decoder uses the level shifter 44 to convert the voltage level of a decoded signal generated by the address decoder, and supplies the converted voltage to the associated word line.

The level shifter 44 has a first switch 46 that is configured of a PMOS transistor and that receives the decoded signal DEC1 (input signal); a voltage conversion circuit 22 that receives, via a node ND1, the decoded signal DEC1 supplied via the first switch 46; a CMOS inverter 48 that outputs, as a word line signal MWL, the decoded signal DEC1 whose voltage level has been converted by the voltage conversion circuit 22; and a second switch 50 configured of a pMOS transistor 50a.

In the present embodiment, the PMOS transistors of the first switch 46, voltage conversion circuit 22, CMOS inverter 48 and second switch 50 have the same threshold voltage value as each other, while the nMOS transistors of the voltage conversion circuit 22 and CMOS inverter 48 have the same threshold voltage value as each other. For this reason, the number of the photo masks used for ion implantation to set the threshold voltage values can be minimized, and hence the layout design (mask design) of the level shifter 44 can be simplified as in the first embodiment.

In the present embodiment, the high level voltages of the decoded signals DEC1 and DEC2 are set to the boost voltage VPP (3 V), while the high level voltage of the control signal CNT is set to the internal power supply voltage VII (1.2 V). The low level voltages of the decoded signals DEC1 and DEC2 and control signal CNT are set to the ground voltage VSS (0 V).

The control signal CNT is generated for use in common to a plurality of word decoders. The control signal CNT is generated from the decoded signal of an upper address signal and serves as a block selecting signal for selecting the plurality of word decoders. The decoded signal DEC1 inputted to the first switch 46 is the decoded signal of a lower address signal outputted from the word decoder. The control signal CNT is generated by the address decoder in the word decoder.

The pMOS transistor of the CMOS inverter 48 receives at its source the decoded signal DEC2. The decoded signal DEC2 exhibits the same logic and changes at the same timing as the decoded signal DEC1. The CMOS inverter 48 outputs to the word line a word line signal MWL (output signal) of the same logic level as the decoded signal DEC1, as will be described later.

The pMOS transistor 50a of the second switch 50 has its drain connected to the output node ND2 of the voltage conversion circuit 22 and has its source connected to the boost voltage line VPP (3 V). The PMOS transistor 50a receives at its gate the decoded signal DEC2. When the pMOS transistor of the CMOS inverter 22a should be turned on, the PMOS transistor 50a is turned on, as will be describe later, to supply the boost voltage VPP to the node ND2. That is, the signal line that supplies the decoded signal DEC2 to the second switch 50 serves as a voltage line for supplying the same voltage as the boost voltage VPP that should be outputted by the voltage conversion circuit 22.

Figure 6:
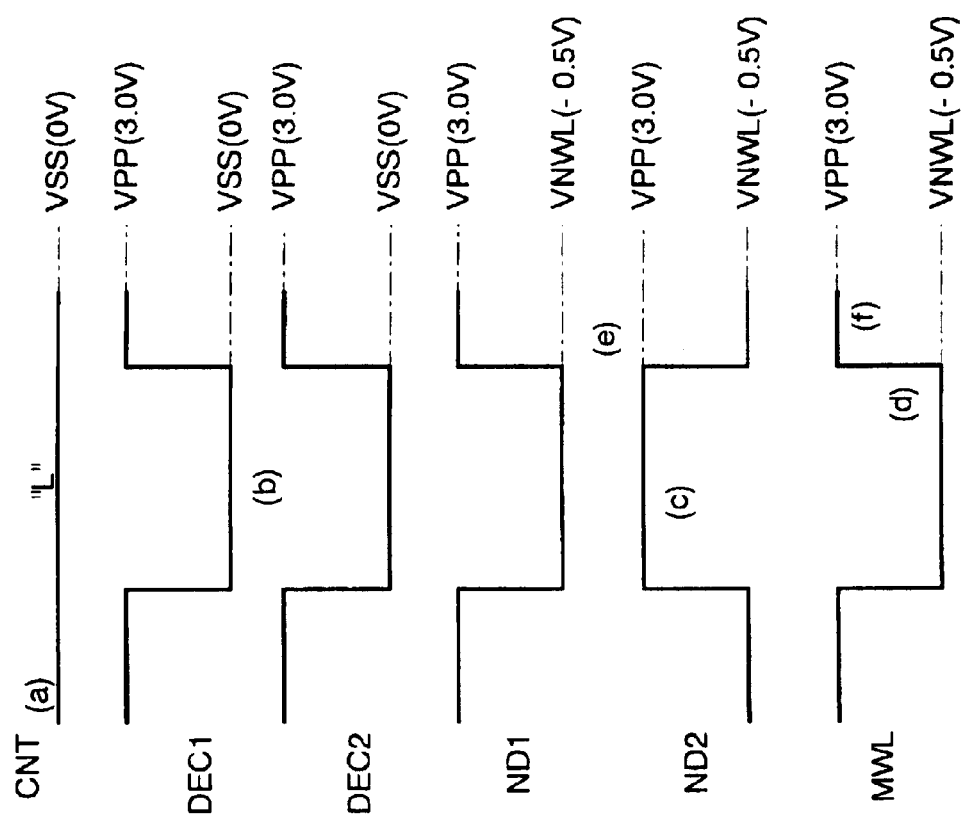
FIG. 6 is a timing diagram showing the operation of the level shifter shown in FIG. 5.

FIG. 6 shows the operation of the level shifter 44 shown in FIG. 5. Detailed descriptions are omitted with respect to operations corresponding to the same operations in the first embodiment (FIG. 3). In the present example, the word decoders associated with a predetermined memory cell array have been activated, and the control signal CNT that controls the first switch 46 in each of those word decoders is held at a low level (VSS) (FIG. 6(a)).

Before the word decoder starts a decoding operation, the decoded signals DEC1 and DEC2 both exhibit the high levels (VPP), and the nodes ND1 and ND2 exhibit the high level (VPP) and the low level (VNWL), respectively.

Thereafter, the address signal is supplied from the exterior of the DRAM, and the decoded signal DEC1 associated with the word line to be selected changes from the high level (VPP) to the low level (VSS), while the decoded signal DEC2 also changes from the high level (VPP) to the low level (VSS) (FIG. 6(b)). The pMOS transistor of the CMOS inverter 22a in the voltage conversion circuit 22 is turned on by the low level of the node ND1. At the same time, the pMOS transistor 50a of the second switch 50 is turned on by the low level of the decoded signal DEC2. That is, in the present embodiment, since the high level of the node ND2 is set not only by the turning-on of the pMOS transistor of the CMOS inverter 22a but also by the turning-on of the pMOS transistor 50a of the second switch 50, the high level of the node ND2 becomes the boost voltage VPP at a high speed without fail (FIG. 6(c)).

Next, the nMOS transistor of the CMOS inverter 48 is turned on by the high level of the node ND2 to output the low level (negative voltage) of the word line signal MWL (FIG. 6(d)). The low level of the word line signal MWL is inverted by a control circuit (not shown), so that the high level voltage (VPP) is supplied to the word line. That is, the word line associated with the address signal is selected to execute the memory operation.

Next, the address decoder in the word decoder completes its operation, and the decoded signals DEC1 and DEC2 change to the high levels VPP. The nodes ND1 and ND2 change to the high level (VPP) and the low level (VNWL), respectively (FIG. 6(e)). In response to the change in the node ND2 to the low level, the word line signal MWL changes to the high level (VPP) (FIG. 6(f)).

The present embodiment can provide the same effects as the first embodiment.

The foregoing embodiments were described as examples where the present invention is applied to the word decoders of the DRAM. The present invention, however, is not limited to such embodiments but may be applied to, for example, other semiconductor memories such as SRAMs and the like.

The invention is not limited to the above embodiments and various modifications may be made without departing from the spirit and scope of the invention. Any improvement may be made in part or all of the components.

What is claimed:

1. A level shifter comprising:

a first switch operating in accordance with a control signal and receiving a first input signal;

a voltage conversion circuit for converting said first input signal having a voltage and being transmitted via said first switch, to an output signal having a different voltage from the voltage of said first input signal; and a second switch connecting an output node of said voltage conversion circuit to a voltage line supplied with a voltage which said voltage conversion circuit should output in accordance with a second input signal synchronizing with said first input signal.

2. The level shifter according to claim 1, wherein:

said first switch, said voltage conversion circuit, and said second switch each includes at least one of pMOS transistors and nMOS transistors; and threshold voltages of the pMOS transistors are equal to each other and/or threshold voltages of the nMOS transistors are equal to each other.

3. The level shifter according to claim 1, wherein:

said voltage conversion circuit has a pair of CMOS inverters that have their inputs and outputs connected to each other and are supplied with a high level voltage and a low level voltage in accordance with their respective logic levels;

said second switch has an nMOS transistor which turns on when the nMOS transistor of one of said CMOS inverters should turn on, and which supplies the low level voltage to said output node, said one of said CMOS inverters receiving said first input signal.

4. The level shifter according to claim 1, wherein:

said voltage conversion circuit has a pair of CMOS inverters that have their inputs and outputs connected to each other and are supplied with a high level voltage and a low level voltage in accordance with their respective logic levels;

said second switch has an pMOS transistor which turns on when the pMOS transistor of one of said CMOS inverters should turn on, and which supplies the high level voltage to said output node, said one of said CMOS inverters receiving said first input signal.

* * * * *